United States Patent [19]

Ruskouski

[11] Patent Number: 5,655,830

[45] Date of Patent: Aug. 12, 1997

[54] LIGHTING DEVICE

[75] Inventor: Charles R. Ruskouski, Danbury, Conn.

[73] Assignee: General Signal Corporation, Stamford, Conn.

[21] Appl. No.: 424,146

[22] Filed: Apr. 17, 1995

Related U.S. Application Data

[63] Continuation-in-part of Ser. No. 281,414, Jul. 27, 1994, Pat. No. 5,526,236, and Ser. No. 160,583, Dec. 1, 1993, Pat. No. 5,410,453.

[51] Int. Cl.$^6$ .................................................. G09F 13/04
[52] U.S. Cl. .................... 362/240; 362/249; 362/800; 362/812
[58] Field of Search .................................. 362/240, 249, 362/800, 812; 315/71, 58, 224, 185 R, 187, 185 S, 225

[56] References Cited

U.S. PATENT DOCUMENTS

| | | | |
|---|---|---|---|
| 4,211,955 | 7/1980 | Ray | 315/53 |
| 4,298,869 | 11/1981 | Okuno | 340/782 |
| 4,630,183 | 12/1986 | Fujita | 362/311 |
| 4,727,289 | 2/1988 | Uchida | 315/71 |
| 4,782,429 | 11/1988 | Walton et al. | 362/20 |
| 4,939,426 | 7/1990 | Menard et al. | 315/185 R |
| 4,965,457 | 10/1990 | Wrobel et al. | 362/249 |
| 5,012,157 | 4/1991 | Walton et al. | 315/66 |
| 5,119,174 | 6/1992 | Chen | 362/373 |
| 5,160,201 | 11/1992 | Wrobel | 362/249 |
| 5,303,124 | 4/1994 | Wrobel | 362/249 |
| 5,388,357 | 2/1995 | Malita | 362/812 |
| 5,410,453 | 4/1995 | Ruskouski | 362/800 |
| 5,416,679 | 5/1995 | Ruskouski et al. | 362/800 |
| 5,463,280 | 10/1995 | Johnson | 315/187 |

FOREIGN PATENT DOCUMENTS

| 4321823 | 1/1995 | Germany | 362/800 |
|---|---|---|---|

OTHER PUBLICATIONS

Product brochure for Merlin Exit Retrofit Kit, Lithonia Lighting Emergency Lighting Systems, One Lithonia Way, Decatur, GA, 30035, Dated Nov. 1994.

Advertisement for Exit Sign Retrofit Kit, *New Equipment Digest*, 1100 Superior Avenue, Cleveland, OH, Mar., 1995.

Product brochure for Watt–Man™ Led Exit Retrofit Lamp, Standard Enterprises Inc., 12958 Harbor Drive, Suite 100, Lake Ridge, VA 22192 ©1995.

Product brochure for Watt–Man™ Led Exit Retrofit Lamp, Printed in USA.

*Primary Examiner*—Ira S. Lazarus
*Assistant Examiner*—Sara Sachie Raab
*Attorney, Agent, or Firm*—Ware, Fressola, Van Der Sluys & Adolphson LLP

[57] ABSTRACT

A long life, low maintenance and low energy consumption-lighting device (15) for connection with an electrical socket within a housing of an exit sign comprises a string (35, 35, 60) of series connected light emitting diodes (38) connected in a circuit comprising a capacitor (55) for limiting the current flow through the light emitting diodes (38) and a resistor (40) to limit the surge current through the light emitting diodes (38). The resistor (40), capacitor (55) and light emitting diodes (38) are connected to the socket by one of several different standard light bulb bases (20), and are housed within a hollow translucent or transparent tube connected to the base (20). A surge suppression device (59), such as a TRANSZORB, may be connected in parallel with the resistor (40), capacitor (55) and light emitting diodes (38) to provide line transient protection for protecting the light emitting diodes (38) in response to transient voltage spikes. The lighting device (15) may be provided with a pair of series connected light emitting diode strings (35, 36) connected in parallel with one another, the diodes (38) in one string (35) being connected in opposite polarity to the diodes (38) in the other string (36). Additionally, the light emitting diodes (38) may be either discrete light emitting diodes (38) or die-on type light emitting diodes (100) mounted on one or both sides of a printed circuit board (105).

8 Claims, 6 Drawing Sheets

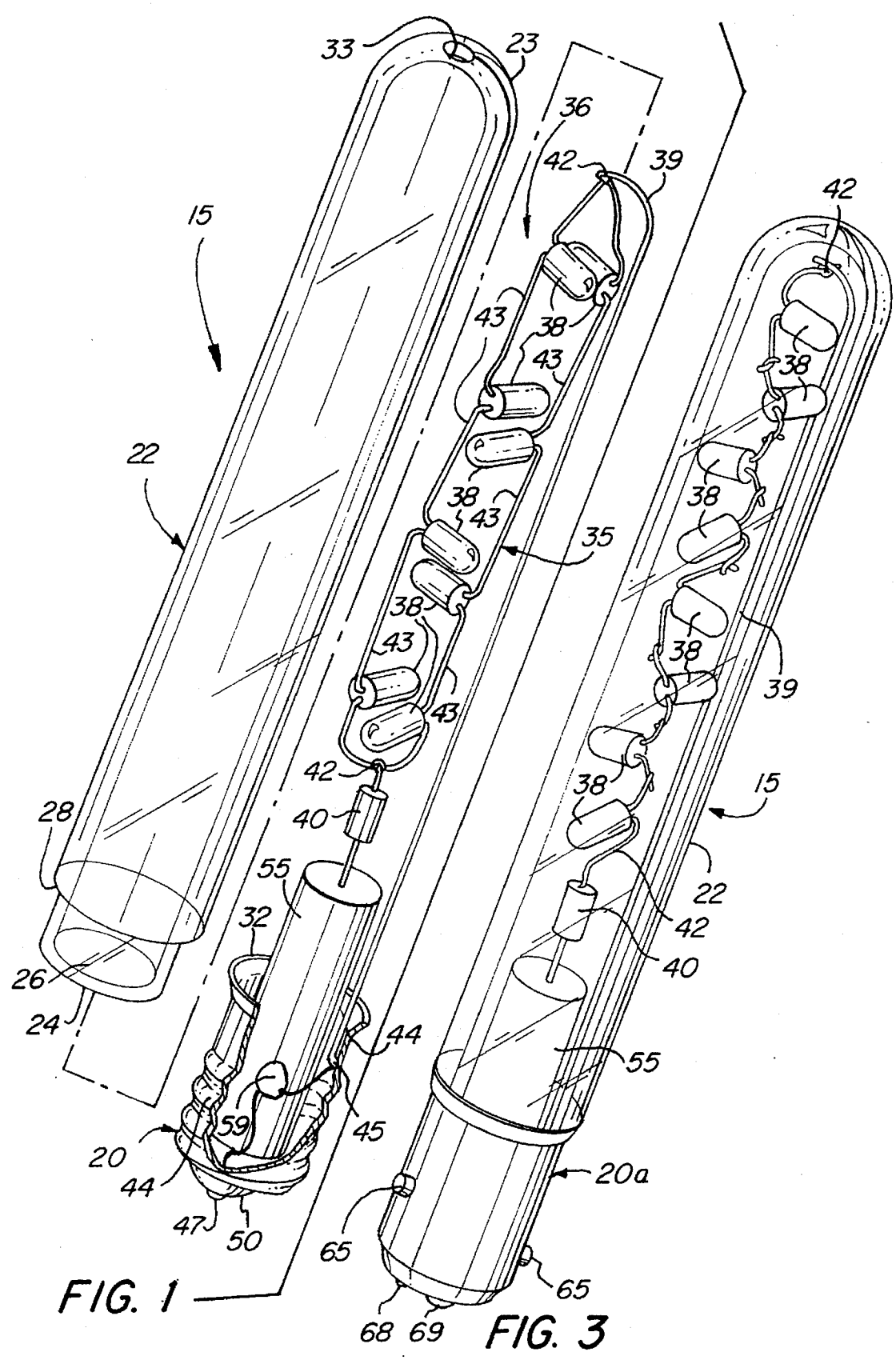

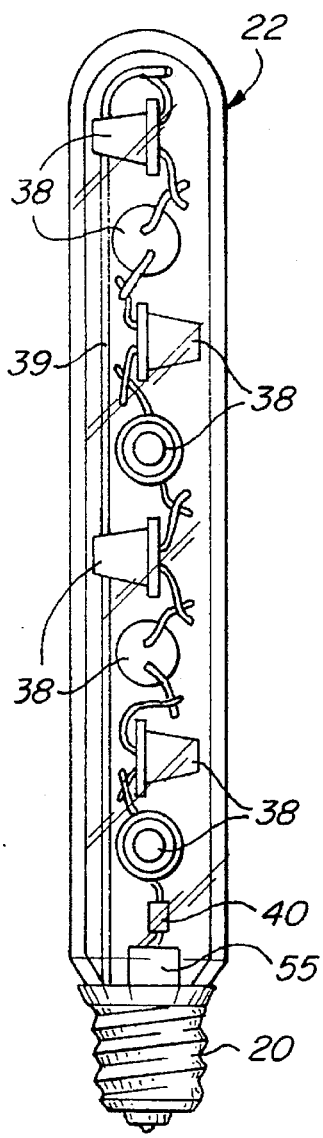
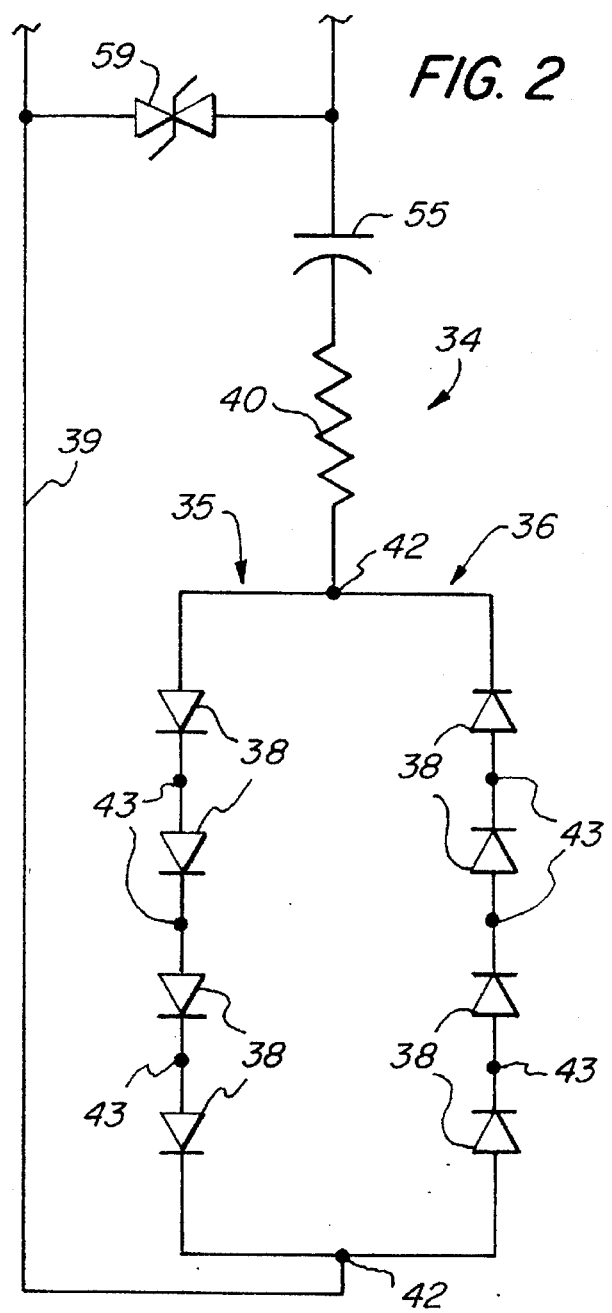

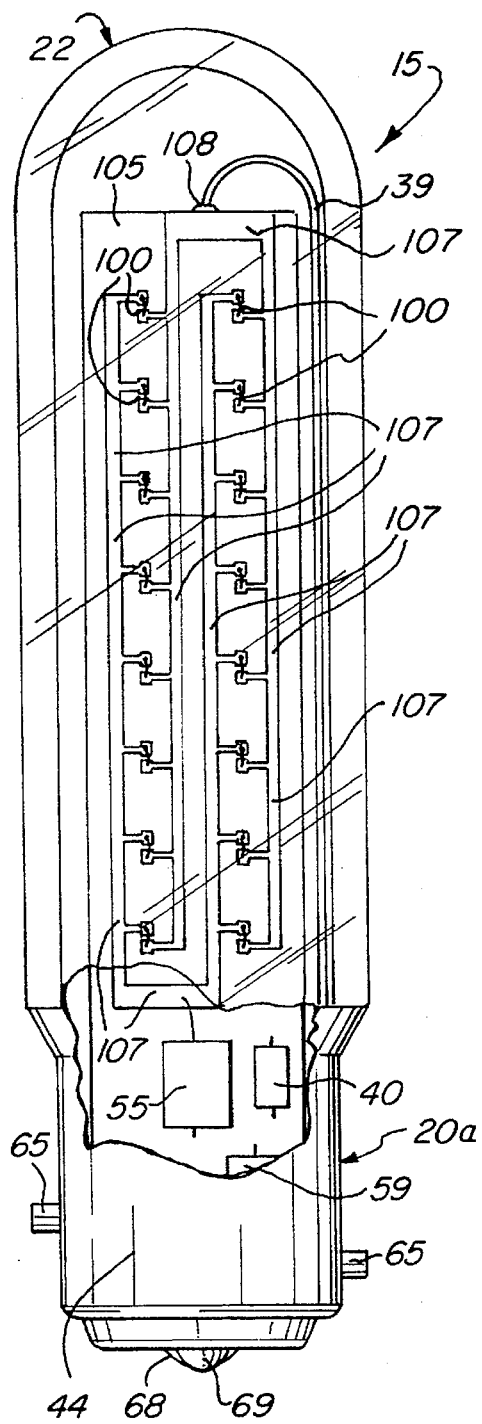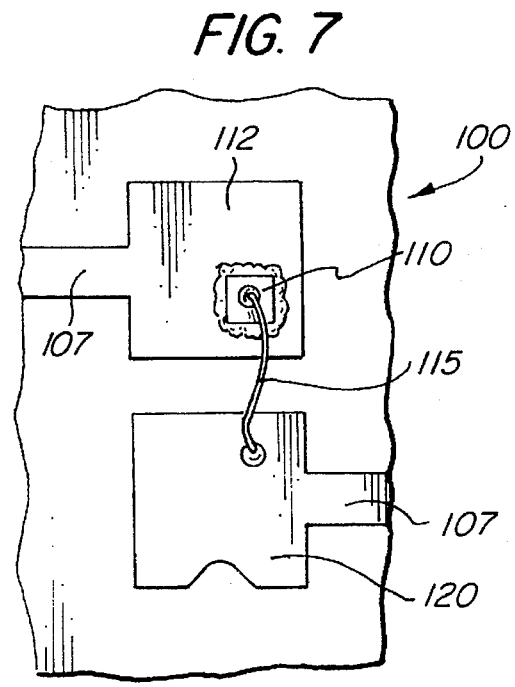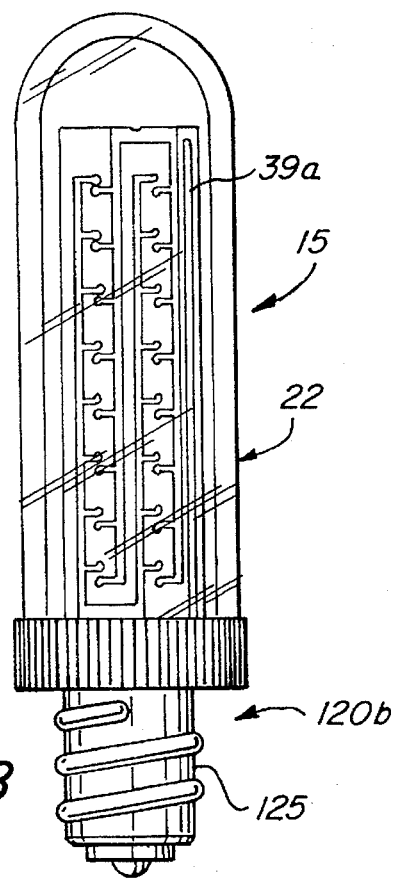

LIGHTING DEVICE

This is a continuation-in-part application of application Ser. No. 08/281,414 filed on Jul. 27, 1994, now U.S. Pat. No. 5,526,236, and a continuation-in-part application of application Ser. No. 08/160,583, filed on Dec. 1, 1993, now U.S. Pat. No. 5,410,453.

TECHNICAL FIELD

The present invention relates to electrical lighting sources and, more particularly, to long life electrical lighting sources for use in illuminated exit signs.

BACKGROUND OF THE INVENTION

Under current local Fire and Building Codes, buildings to which the public have access are required to have signage therein identifying the exits. Most of these signs are required to exhibit a specific amount of illumination.

Traditionally, two 15-watt incandescent light bulbs driven by 120 volt alternating current (120 VAC) have been employed to provide normal illumination. Additionally, a pair of 3.6-watt incandescent light bulbs driven by a self contained emergency back-up battery power supply may be provided for illumination during power failure situations.

While these traditional exit sign lighting arrangements perform adequately, they do have a few drawbacks. A major drawback is that the incandescent bulbs use large amounts of electrical power resulting in relatively large operating costs. The 15-watt bulbs generally remain illuminated 24 hours a day, 365 days a year thereby consuming large amounts of power while the emergency 3.6-watt bulbs require a large battery power supply to remain illuminated for the required period of time during power failure situation. Furthermore, while the incandescent bulbs provide adequate illumination, such bulbs do not have a long life in service and require frequent replacement, therefore contributing to the large operational costs associated with inspection and replacement of the bulbs.

To overcome some of the drawbacks associate with high voltage, large power consumption incandescent bulbs, a light device has been developed wherein each high voltage incandescent bulb is replaced by a plurality of series connected, low voltage incandescent lamps. Such a device is shown and described in U.S. Pat. No. 4,782,429.

While the above described device has a longer life in service and reduced energy consumption as compared to high voltage incandescent bulbs, the low voltage incandescent bulbs are still subject to failure, particularly in response to mechanical shock. To alleviate the drawbacks associated with incandescent bulbs, many manufacturers utilize light emitting diodes (LED) rather than incandescent bulbs in exit signs. Each light emitting diode provides a relatively small amount of light as compared to traditional incandescent bulbs, and therefore a large number of light emitting diodes must be used to provide the same amount of illumination offered by traditional incandescent bulbs. For the replacement of incandescent bulbs with light emitting diodes in existing exit signs, special tools, adapters, and other rewiring is typically required.

SUMMARY OF THE INVENTION

It is an object of the present invention to provide a novel lighting device for an exit sign using a plurality of light emitting diodes.

It is a further object of the present invention to provide such a lighting device having a plurality of light emitting diodes encased in a hollow plastic or glass tube and having one of several different standard light bulb bases for connection in a lighting socket for energizing the light emitting diodes with either a primary or emergency source of electrical power.

A still further object of the present invention is to provide such a lighting device using either discrete light emitting diodes or die-on type light emitting diodes mounted on a printed circuit board.

A still further object of the present invention is to provide such a lighting device in which the light emitting diodes emit a sufficient amount of illumination as required by building codes.

A further object of the present invention is to provide such a lighting device which may be readily and economically fabricated and will enjoy a long life in operation.

According to the present invention, a plurality of series connected light emitting diodes are connected in a circuit comprising circuit means for limiting the current flow through the light emitting diodes to thus maintain a desired forward voltage drop across each of the light emitting diodes and which also acts as a surge current limiter to limit the surge current through the light emitting diodes, the circuit means and light emitting diodes being connected to a power source by one of several different standard light bulb bases, and being housed within a hollow translucent or transparent plastic or glass tube.

In further accord with the present invention, the current limiting means comprises at least a capacitor to limit the current flow through the light emitting diodes, and a resistor which serves to reduce the current surge when the lighting device is first turned on. At such times when the lighting device is first energized, the resistance of the light emitting diodes is quite low while the resistance of the resistor remains relatively constant and thus materially increases the resistance of the lighting device upon energization relative to what it would be if only the light emitting diodes were present.

In still further accord with the present invention, a surge suppression device may be provided in the circuit means to provide line transient protection for protecting the light emitting diodes in response to transient voltage spikes. Such a protection device may be a TRANSZERB, varistor, or the like.

According further to the present invention, the lighting device may be provided with a pair of series connected light emitting diode strings connected in parallel with one another.

According still further to the present invention, the light emitting diodes may be discrete light emitting diodes or die-on type light emitting diodes mounted on one or both sides of a printed circuit board.

The present invention provides a significant improvement over the prior art by providing light emitting diodes within a replacement bulb type structure for replacing incandescent bulbs within an illuminated sign. The lighting devices may be installed in an existing incandescent exit sign by connection to the existing mounting fixture (lighting socket) in the sign. The device may be provided with a plurality of different types of mounting bases for mounting to different incandescent bulb mounting fixtures. The light emitting diodes consume significantly less power than known incandescent bulbs, thereby greatly reducing the operating costs of the exit sign. Additionally, light emitting diodes have a significantly longer life in service than known incandescent bulbs, thereby greatly reducing the cost associated with bulb replacement and maintenance of the exit sign. The light emitting diodes provide bright, uniform illumination that meets code requirements for exit signs. No special tools or adapters are required for use with the replacement lighting devices.

The light emitting diodes may be discrete light emitting diodes connected in series, or die-on type light emitting diodes connected in series, with either type of light emitting diode mounted on one or both sides of a printed circuit board. If the light emitting diodes are mounted on a printed circuit board, the printed circuit board is appropriately sized and positioned within the hollow tube for emitting light from the tube for illuminating the exit sign.

The foregoing and other objects, features and advantages of the present invention will become more apparent in light of the following detailed description of exemplary embodiments thereof, as illustrated in the accompanying drawings.

BRIEF DESCRIPTION OF THE DRAWINGS

FIG. 1 is an exploded perspective view of the lighting device of the present invention having its intermediate size screw base broken away to show internal structure;

FIG. 2 is a schematic block diagram of the lighting device of FIG. 1;

FIG. 3 is a perspective view of a second embodiment of the lighting device of the present invention which includes a bayonet type base;

FIG. 4 is a side elevational view of a third embodiment of the lighting device of the present invention;

FIG. 6 is a side elevational view of fourth embodiment of the lighting device of the present invention which uses die-on type light emitting diodes and has a portion broken away to show internal structure;

FIG. 7 is an enlarged fragmentary elevational view of a portion of the printed circuit board from the fourth embodiment of the present invention of FIG. 6 showing a die-on type light emitting diode;

FIG. 8 is a side elevational view of an alternative embodiment of the lighting device of FIG. 6 which has a screw base;

DETAILED DESCRIPTION OF THE INVENTION

Figure 5:
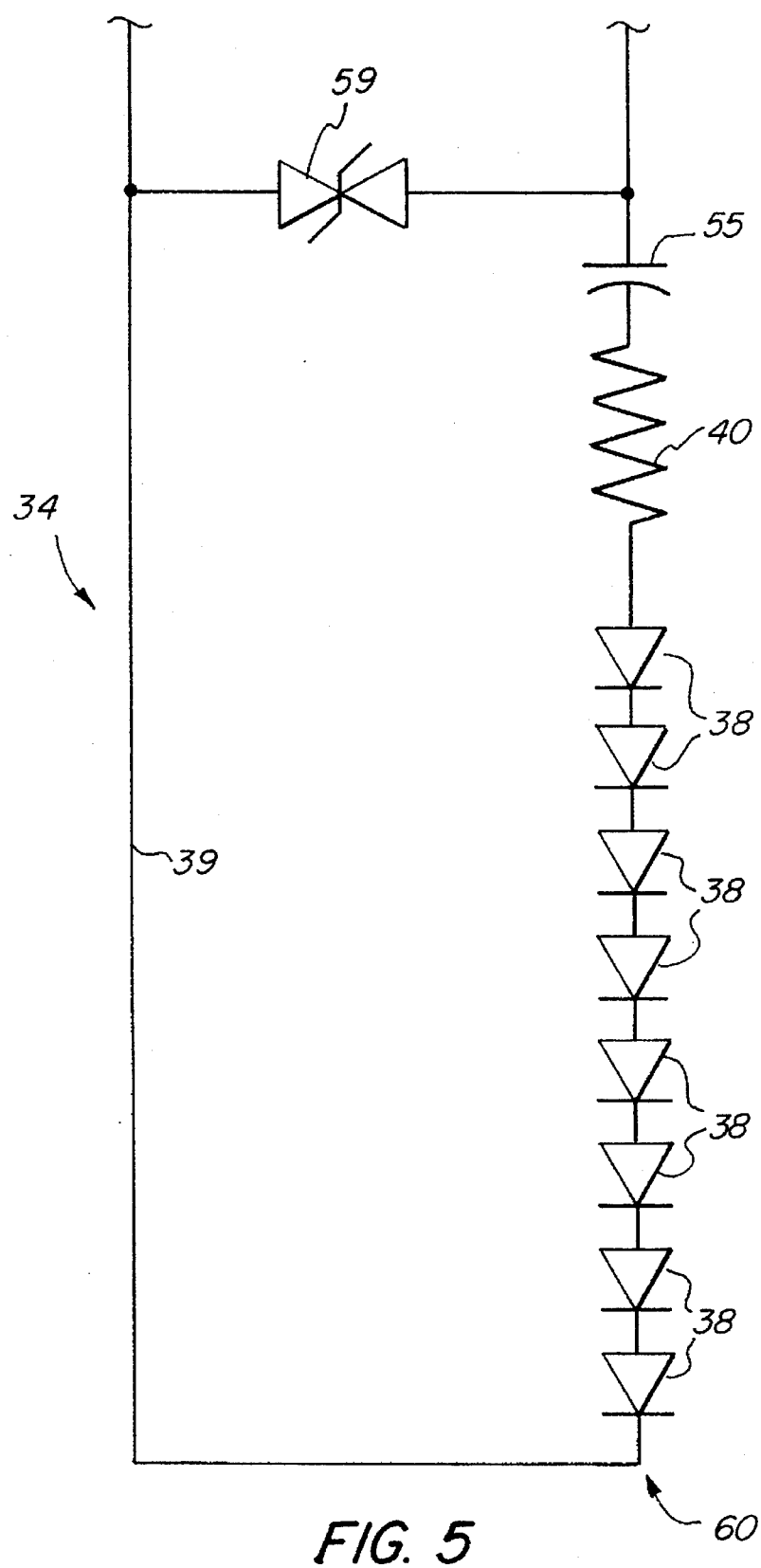
FIG. 5 is a schematic block diagram of the lighting devices of FIGS. 3 and 4.
Figure 10:
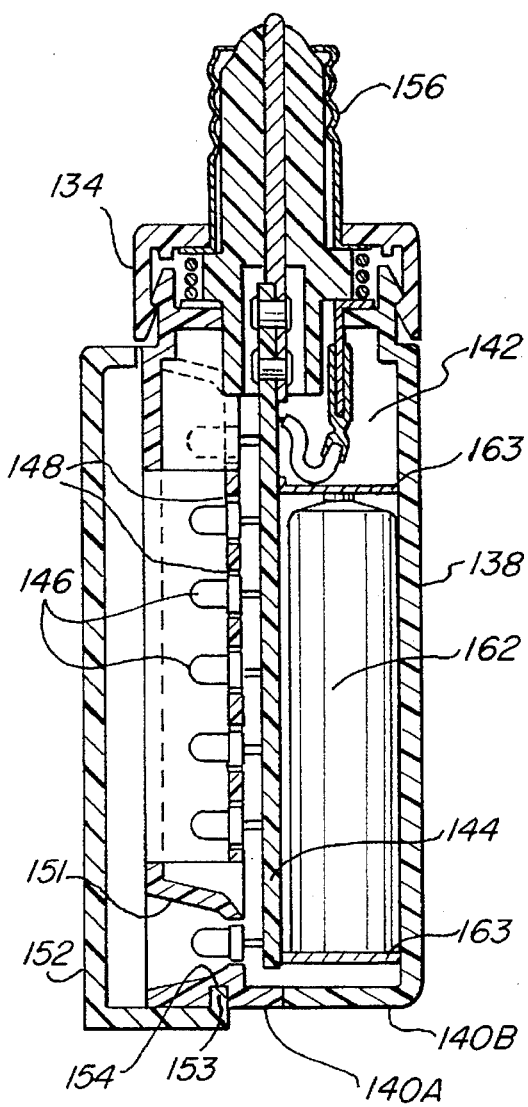
FIG. 10 is a cross-sectional view of the lighting device taken along the 10—10 line of FIG. 9.
Figure 9:
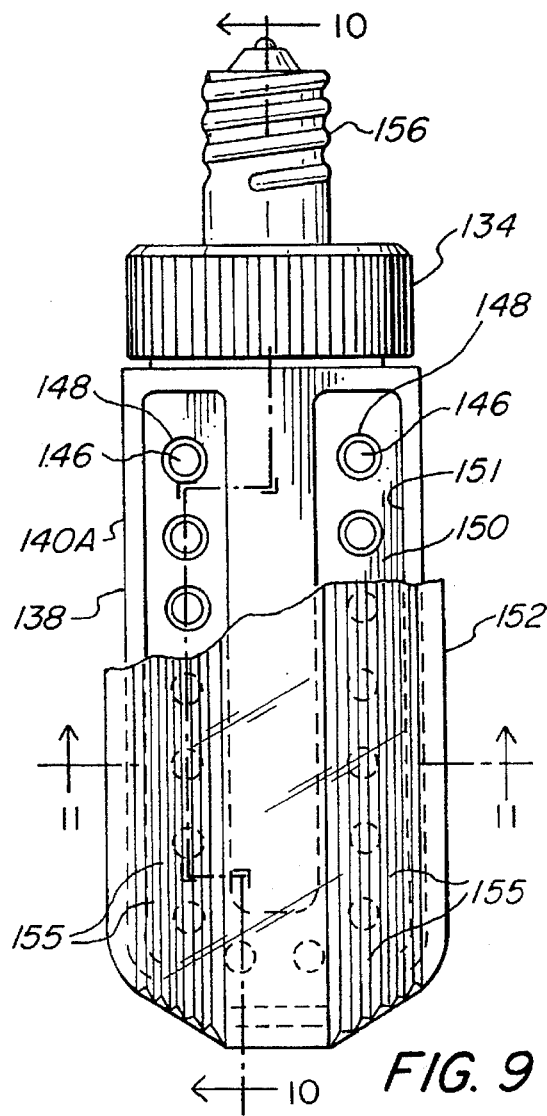
FIG. 9 is a side elevational view of a fifth embodiment of the lighting device of the present invention with a portion of a diffuser broken away to illustrate internal structure.

Referring first to FIG. 1, therein is illustrated a lighting device 15 of the present invention comprising a standard screw-type mounting base 20. The lighting device 15 of the present invention is particularly well suited for providing a long life, low maintenance and low energy consumption light source for a conventional lighted exit sign. The mounting base 20 is designed for mating engagement with a corresponding standard lighting socket (not shown) within an exit sign housing (not shown), the lighting socket being supplied with a primary and/or emergency source of electrical power.

The mounting base 20 is designed for mounting engagement with a transparent or translucent (light transmissible) tube 22, made from a glass or plastic material and having a domed end 23. The tube 22 has an open end 24 having a section 26 with a reduced outside diameter. This section 26 is designed to be received within the mounting base 20 until a shelf or lip 28 of the tube 22 contacts a lip 32 of the mounting base 20. To maintain secure engagement between the tube 22 and the mounting base 20, an adhesive (not shown) may be applied to the lip 32 of the mounting base 20 for permanently securing the mounting base 20 and the tube 22 after assembly of the lighting device 15. The tube 22 is shown as being a transparent colorless tube, however, the tube 22 may be either clear or frosted, and may be colored or colorless, as desired. The combination of the mounting base 20 and the tube 22 define an enclosure, and the dimensions of the tube 22, e.g., length and circumference, are selected to meet the desired lighting requirement and to provide sufficient area within the tube 22 to receive lighting circuit components, as will be described hereinafter. The tube 22 may be provided with at least one vent hole 33 for heat dissipation and/or ventilation.

As shown in FIG. 1, a lighting circuit 34 (FIG. 2) is provided which comprises two parallel strings 35, 36 of series connected light emitting diodes 38. The strings 35, 36 of light emitting diodes 38 are connected at one end to a conductor 39 and at the other end to a resistor 40. The connection of the strings 35, 36 to the conductor 39 and the resistor 40 is provided by solder joints 42. Additionally, the connections between the series connected light emitting diodes 38 may be provided by solder joints 43. The other end of the conductor 39 is connected to an outer shell 44 of the mounting base 20 by a solder joint 45. The conductor 39 is a generally rigid member which supports the strings 35, 36 of light emitting diodes 38 between the mounting base 20 and the domed end 23 of the tube 22. The outer shell 44 of the mounting base 20 provides an outer electrical terminal of the mounting base 20. The outer shell 44 is insulated or separated from a center contact 47 for the mounting base 20 by a circular insulating portion 50. The center contact 47 provides an inner electrical terminal of the mounting base 20. The mounting base 20 illustrated in FIG. 1 is an intermediate screw base of the type well known in the art for interconnection with an intermediate lamp socket (not shown).

As described above, one end of the resistor 40 is connected to the parallel strings 35, 36 of series connected light emitting diodes 38 at a solder joint 42. The other end of the resistor 40 is connected to one end of a capacitor 55. The other end of the capacitor 55 is connected to the center contact 47 of the mounting base 20. It will therefore be understood by those skilled in the art that a complete circuit is provided between the center contact 47 and the outer shell 44 by the series connected capacitor 55, resistor 40, parallel strings 35,36 of series connected light emitting diodes 38 and the conductor 39. The capacitor 55 is provided to limit the variations in the current flow through the light emitting diodes 38 and to thus maintain the forward voltage drop across the light emitting diodes 38 within the limits of each light emitting diode 38. The resistor 40 acts as a surge current limiter to reduce the effects of surge currents, particularly upon energization and de-energization of the lighting device 15. In one embodiment of the present invention illustrated in FIG. 1, the value of the capacitance is approximately 0.47 microfarads, and the value of the resistor is approximately 50 ohms. These resistance and capacitance values are provided for illustrative purposes only. As will be understood by those skilled in the art, the actual values of resistance and capacitance used will vary in a given lighting device depending upon the number and type of light emitting diodes used.

To further enhance the reliability and long life of the lighting device 15 of the present invention, a transient protection device 59 may be connected between the outer shell 44 and the center contact 47 of the mounting base 20. As illustrated in FIG. 1, the transient protection device 59 is a TRANSZORB which isolates the light emitting diodes 38 from high voltage surges.

In the embodiment of the invention illustrated in FIG. 1, one light emitting diode 38 in one of the strings 35 of series connected light emitting diodes 38 is associated with a light emitting diode 38 in the other string 36 of series connected light emitting diodes 38. These pairs of light emitting diodes 38 are positioned generally adjacent to one another and are oriented 180 degrees with respect to each other. Therefore, the light from one light emitting diode 38 in the pair of light emitting diodes 38 is generally directed in a direction 180 degrees from the light from the other light emitting diode 38 in the pair of light emitting diodes 38. Additionally, as illustrated in FIG. 1, adjacent pairs of light emitting diodes 38 are generally positioned in a 90 degree orientation with respect to each other. It is expected that this orientation of the various pairs of light emitting diodes 38 will provide a generally uniform distribution of light from the lighting device 15.

In the embodiment of the lighting device 15 shown in FIG. 1, four light emitting diodes 38 are shown in each string 35, 36 of series connected light emitting diodes 38, thereby forming four pairs of light emitting diodes 38. The light emitting diodes illustrated in FIG. 1 are discrete light emitting diodes of the type well known in the art which include a semi-conductor light emitting diode device embedded in a molding of a light-transmissible resin material. In the lighting device 15 of FIG. 1, a clear light-transmissible material is used in the series connected light emitting diodes 38. As is well known in the art, clear or white light emitting diodes 38 have a generally high intensity, and are particularly well suited for use with the lighting device 15 of the present invention. As will be understood by those skilled in the art, the number of light emitting diodes 38 used in each string 35,36 of the series connected light emitting diodes 38 will depend on the power output, e.g., the amount of illumination, provided by the light emitting diodes 38 used in the strings. Additionally, as will be understood by those skilled in the art, it may be desirable to provide light emitting diodes 38 having a resin material which is colored, e.g., red, amber or green, depending on the particular application of the lighting device 15. In such case, additional light emitting diodes 38 may be required in the series connected light emitting diodes 38, particularly for lower intensity light emitting diodes 38 such as green light emitting diodes.

FIG. 2 is a schematic diagram of the lighting circuit 34 of FIG. 1. Referring to FIG. 2, the capacitor 55 and resistor 44 are shown connected in series with the two parallel strings 35, 36 of series connected light emitting diodes 38. All of the light emitting diodes 38 in one string 35 are connected in opposite polarity to all of the light emitting diodes 38 in the other string 36. This arrangement is particularly useful with an alternating current (AC) source of power because each string will be supplying illumination during alternating half-cycles of the AC current. The transient protection device 59 is shown connected in parallel with the other circuit components 55, 40, 38.

Referring now to FIG. 3, a second embodiment of the present invention is shown. In the embodiment of FIG. 3, rather than having two strings 35, 36 (FIG. 1) of series connected light emitting diodes 38 connected in parallel with one another, a single string 60 (FIG. 5) of series connected light emitting diodes 38 is provided. As with FIG. 1, one end of the series connected light emitting diodes 38 is connected to the conductor 39 at a solder joint 42 and the other end of the series connected light emitting diodes 38 is connected at a solder Joint 42 to a series connected resistor 40 and capacitor 55 circuit. A transient limiting device, such as a TRANSZORB similar to the TRANSZORB 59 shown in FIG. 1, may be provided in parallel with the light emitting diodes 38 if desired. Additionally, the mounting base 20a of the lighting device 15 of FIG. 3 is a bayonet type mounting base 20a of the type well known in the art having a pair of bayonets 65 extending generally perpendicular from opposite sides of the mounting base 20a. Rather than having a center contact 47 (FIG. 1) and an outer shell 44 (FIG. 1) for providing electrical terminals for the lighting device 15, a pair of bottom mounted electrical contacts 68, 69 are provided on the bottom of the bayonet type mounting base 20a for providing one of the electrical contacts, and the outer shell 44 of the bayonet base provides the other electrical contact, the configuration of the bayonet style base being well known in the art.

To provide a generally uniform distribution of light from the lighting device 15 of FIG. 3, each of the adjacent light emitting diodes 38 are oriented 90 degrees with respect to each other in a generally spiraling or circular pattern. This orientation of the series connected light emitting diodes 38 is further illustrated in FIG. 4. Additionally, in FIG. 4, the lighting device 15 of FIG. 3 is shown as provided with a screw type mounting base 20. FIG. 5 is a schematic diagram of the lighting circuit for the lighting device of FIGS. 3 and 4. In contrast to the lighting circuit of FIG. 2, which shows two parallel strings 35, 36 of series connected light emitting diodes, the lighting circuit of FIG. 5 comprises a single string 60 of series connected light emitting diodes 38. All of the other circuit components being the same.

The invention has been described thus far as using either a single string 60 (FIGS. 3, 4 and 5) of series connected light emitting diodes 38 or a pair of strings 35,36 (FIGS. 1 and 2) of series connected light emitting diodes 38, the pair of strings 35,36 (FIG. 1) being connected in parallel with one another. However, as seen in FIG. 6, the invention also contemplates using a plurality of series connected light emitting diodes 100 mounted on one or both sides of a printed circuit board 105. Referring to FIG. 7 in conjunction with FIG. 6, the lighting device 15 of the invention is shown being implemented with a plurality of series connected light emitting diodes 100 of the "die-on" type mounted on a printed circuit board 105. The printed circuit board 105 has mounted thereon electrical contacts 107, e.g., micro strip, which is connected at one end 108 to the conductor 39 and at the other end (not shown) to one of the bottom contacts 68,69 of the mounting base 20a. The outer shell 44 is connected to the conductor 39. The resistor 40, capacitor 55 and TRANSZORB 59 circuit may be mounted directly on the printed circuit board 105 as shown, or the circuit may be mounted between the printed circuit board 105 and the one bottom contact 68 (not shown).

Each side of printed circuit board 105 illustrated in FIG. 6 has two parallel rows of series connected die-on type light emitting diodes 100. Each row of die-on type light emitting diodes includes eight light emitting diodes 100. However, the number of rows of series connected die-on type light emitting diodes 100, and the number of light emitting diodes 100 in each row may be varied as desired to provide the desired amount of illumination.

Referring again to FIG. 7, one of the die-on light emitting diodes 100 is shown in greater detail. As is known in the art, the die-on light emitting diode 100 includes a semiconductor light emitting diode device 110 which is connected on one side to an electrical contact 112 which is interconnected by the electrical conductor 107 to the bottom contacts 68, 69 (FIG. 6). The other side of the semiconductor light emitting diode device 110 is connected via a jumper 115 to a contact 120. The contact 120 is connected to the outer shell 44 (FIG. 6) via the electrical conductor 107 and the conductor 39 (FIG. 6).

Although the invention is illustrated in FIG. 6 with die-on type light emitting diodes 100 mounted on the printed circuit board 105, it will be understood by those skilled in the art that discrete light emitting diodes, like those shown in FIGS. 1, 3 and 4, may be mounted on the printed circuit board, as described in greater detail hereinafter with respect to FIGS. 9–12. Additionally, although the invention is shown in FIG. 6 using a conductor 39 to connect one end 108 of the microstrip 107 to the outer shell 44, the conductor 39 may be replaced with a microstrip conductor 39a (FIG. 8) directly mounted on the printed circuit board 105.

The lighting device 15 of FIG. 6 is shown as having a bayonet style base 20a; however, as will be understood by those skilled in the art, the lighting device 15 may be used with any known type of mounting base such as an intermediate screw base, a candelabra screw base, or an edison screw base, or any size or configuration bayonet style base. Referring to FIG. 8, it may be desirable to provide the lighting device 15 with an adjustable screw base 120b which allows adjustment of the orientation of the tube 22 relative to a threaded screw base 125. An adjustable base 120b of this type is shown and described in a commonly owned co-pending U.S. patent application Ser. No. 08/160,423, filed on Dec. 1, 1993, now U.S. Pat. No. 5,410,453, entitled Mounting Base Assembly for a Lighting Device Used in an Exit Sign, by inventors Charles R. Ruskouski and James J. Burnes, which is hereby incorporated by reference, particularly, FIGS. 5 and 6 and the description thereof.

Figure 11:
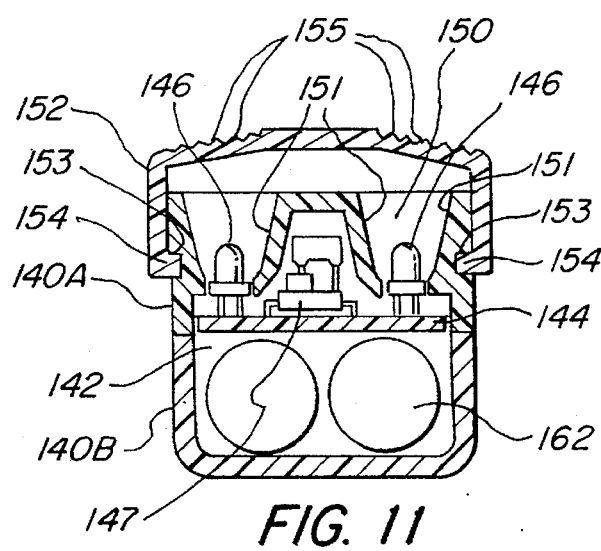
FIG. 11 is a cross-sectional view of the lighting device taken along the 11—11 line of FIG. 9.
Figure 12:
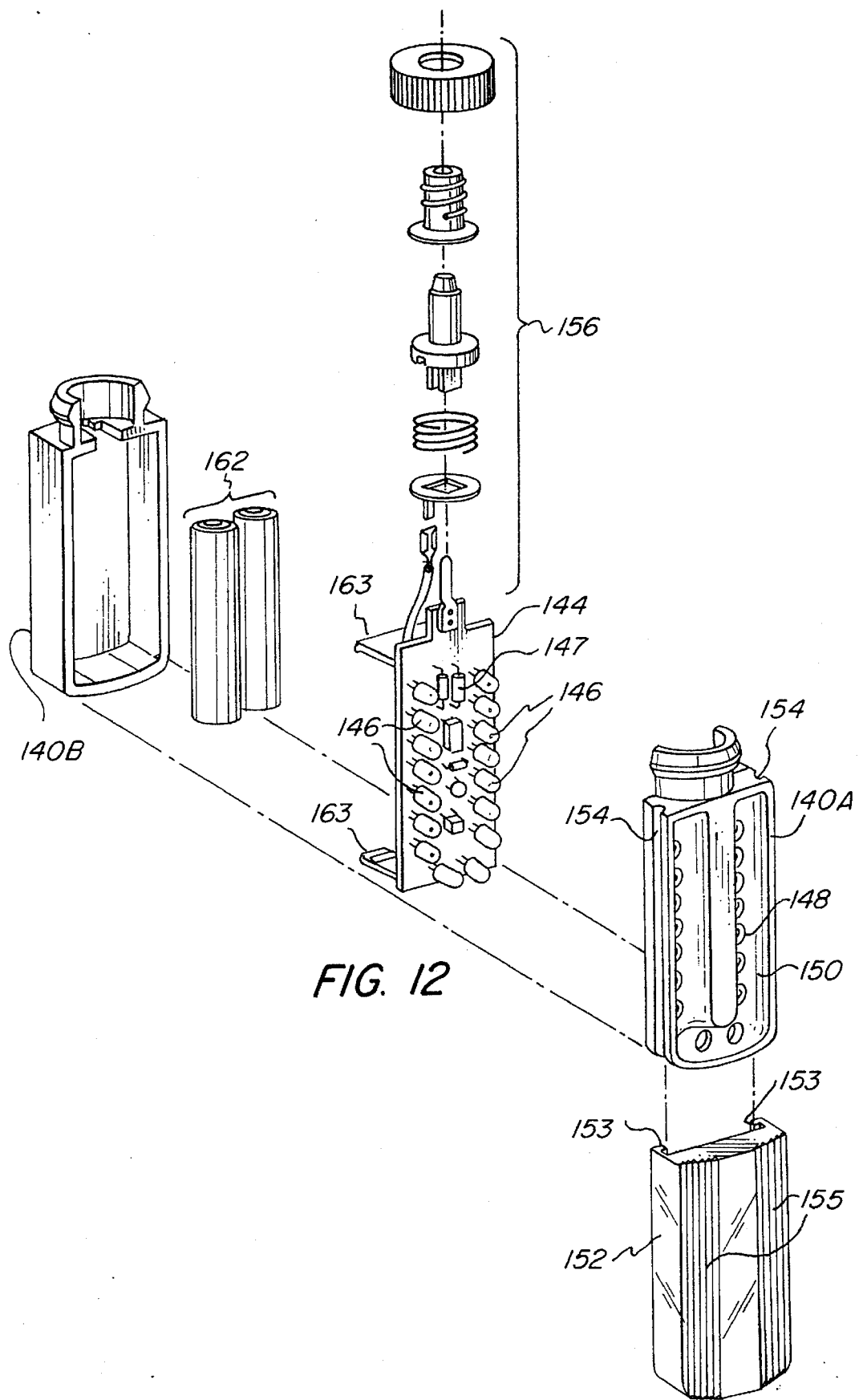
FIG. 12 is an exploded perspective view of the lighting device of FIG. 9.

Referring to FIGS. 9–12, a fifth embodiment of the light emitting diode lighting devices 134 has an elongated generally rectangular plastic lighting device housing 138 having front and rear halves 140A,140B forming an enclosure 142. Inside the enclosure 142 in the elongated rectangular plastic housing 138 is a printed circuit board 144 with a plurality of light emitting diodes 146 in a U-shaped pattern on one side thereof with a plurality of electrical components 147 (FIG. 11) positioned between the light emitting diodes. The light emitting diodes 146 may be connected in series, parallel, or series-parallel. The light emitting diodes 146 extend parallel to one another and are positioned to extend through apertures 148 in a U-shaped channel 150 in the front half 140A. The U-shaped channel 150 has sloping side walls 151 designed to direct light rays from the light emitting diodes 146 in an appropriate illumination pattern. As shown in FIG. 11, the electrical components 147, extend into a cavity formed by the sloping side walls 151 in the center of the elongated rectangular plastic housing 138.

The plastic housing 138 can be made of an opaque material such as polyphenylene oxide (NORYL N-190 made by General Electric) and polycarbonate (XANTAR G4F-23R made by DSM Polymers & Hydrocarbons BV). Desirably, to achieve a satisfactory dispersion of the light emanating from the light emitting diodes 146, the lighting device housing 138 is provided with a translucent or clear plastic diffuser 152. The diffuser 152 has a lip portion 153 slideably received in a groove 154 on the lighting device housing 138 and has longitudinally extending ribbed surfaces 155 to scatter the light rays as they pass through the diffuser 152.

The position of the light emitting diode lighting devices 134 can be adjusted to obtain the desired illumination. To obtain this type of adjustment, the light emitting diode lighting devices 134 are provided with mounting base assemblies 156 which permit adjustment of the elongated rectangular plastic housings 138 relative to the mounting base assemblies 156 once the assemblies 156 are fully inserted and tightened into their respective screw-type lamp sockets 136. The adjustment of the elongated rectangular plastic housings 138 relative to the mounting base assemblies 156 is described in the aforementioned copending U.S. patent application Ser. No. 08/160423 filed Dec. 1, 1993, now U.S. Pat. No. 5,410,453, entitled MOUNTING BASE ASSEMBLY FOR A LIGHTING DEVICE USED IN AN EXIT SIGN by inventors Charles R. Ruskouski and James J. Burnes, which is hereby incorporated by reference, with particular reference to FIGS. 5 and 6 and the description thereof.

Although the invention has been illustrated with a generally elongate, tubular shaped bulb 22, it is expected that various other ornamental bulb configurations may be used with the lighting device of the present invention.

Although the invention has been described and illustrated with respect to exemplary embodiments thereof, it should be understood by those skilled in the art that the foregoing and various other changes, omissions and additions may be made therein and thereto without departing from the spirit and scope of the present invention.

What is claimed is:

1. A lighting device adapted to be powered by a source of electrical power supplied to an electrical socket, the lighting device comprising:
   (a) a mounting base for mating engagement with the socket, said mounting base having a first electrical terminal and a second electrical terminal;
   (b) a light transmissible hollow bulb mounted on said mounting base, said mounting base and said bulb cooperating to form an enclosure; and
   (c) a lighting circuit positioned within said enclosure and electrically connected between said first and second electrical terminals, said lighting circuit comprising a first plurality of series connected light emitting diodes connected in parallel with a second plurality of series connected light emitting diodes;
   (d) wherein all of said light emitting diodes in said first plurality of series connected light emitting diodes are electrically connected in opposite polarity of all of said light emitting diodes in said second plurality of series connected light emitting diodes;
   (e) wherein said light emitting diodes are mounted on at least one side of a printed circuit board; and
   (f) wherein said light emitting diodes are die-on type light emitting diodes.

2. A lighting device according to claim 1, wherein said lighting circuit includes circuit means electrically connected in series with said first and second plurality of series connected light emitting diodes, said circuit means limiting current flow and surge currents through said light emitting diodes.

3. A lighting device according to claim 2, wherein said circuit means includes a capacitor, electrically connected in series with said first and second plurality of series connected light emitting diodes, to limit current flow through said light emitting diodes.

4. A lighting device according to claim 3, wherein said circuit means includes a resistor, electrically connected in series with said capacitor, said resistor limiting surge currents through said light emitting diodes.

5. A lighting device according to claim 2, wherein said lighting circuit includes a surge suppression device electrically connected between said first electrical terminal and said second electrical terminal in parallel with said first and second plurality of series connected light emitting diodes and said circuit means, said surge suppression device protecting said light emitting diodes against transient voltage spikes in the source of electrical power.

6. A lighting device according to claim 5, wherein said surge suppression device is a TRANSZORB.

7. A lighting circuit according to claim 5, wherein said circuit means and said surge suppression device are positioned adjacent to said mounting base.

8. A lighting device according to claim 2, wherein said circuit means are mounted adjacent to said mounting base.

* * * * *